United States Patent [19]

Taylor

[11] Patent Number: 5,475,642
[45] Date of Patent: Dec. 12, 1995

[54] DYNAMIC RANDOM ACCESS MEMORY WITH BIT LINE PREAMP/DRIVER

[76] Inventor: David L. Taylor, 1101 Cambridge Dr., Carrollton, Tex. 75007

[21] Appl. No.: 902,387

[22] Filed: Jun. 23, 1992

[51] Int. Cl.⁶ .................................................. G11C 7/00
[52] U.S. Cl. ........................... 365/203; 365/149; 365/190; 365/205
[58] Field of Search ..................................... 365/149, 190, 365/203, 205

[56] References Cited

U.S. PATENT DOCUMENTS

| | | | |
|---|---|---|---|
| 4,025,907 | 5/1977 | Karp et al. | 340/173 |
| 4,658,377 | 4/1987 | McElroy | 365/149 |
| 4,748,596 | 5/1988 | Ogura et al. | 365/205 |
| 4,777,625 | 10/1988 | Sakui et al. | 365/189 |
| 4,807,194 | 2/1989 | Yamada et al. | 365/207 |
| 4,825,418 | 4/1989 | Itoh et al. | 365/207 |
| 4,831,594 | 5/1989 | Khosrovi et al. | 365/222 |
| 4,858,193 | 8/1989 | Furutani et al. | 365/203 |
| 4,872,142 | 10/1989 | Hannal | 365/189.07 |
| 4,888,732 | 12/1989 | Inoue et al. | 365/51 |
| 4,888,736 | 12/1989 | Hashimoto et al. | 365/189.01 |
| 4,910,709 | 3/1990 | Dhong et al. | 365/149 |
| 4,916,661 | 4/1990 | Nawaki et al. | 365/51 |
| 4,916,667 | 4/1990 | Miyabayashi et al. | 365/207 |
| 4,916,669 | 4/1990 | Sato | 365/230.05 |
| 4,916,671 | 4/1990 | Ichiguchi | 365/233 |
| 4,922,460 | 5/1990 | Furutani et al. | 365/207 |
| 4,936,382 | 6/1990 | Thomas | 166/88 |
| 4,943,944 | 7/1990 | Sakui et al. | 365/189.08 |
| 4,947,376 | 8/1990 | Arimoto et al. | 365/205 |
| 4,947,377 | 8/1990 | Hannai | 365/149 |
| 4,954,992 | 9/1990 | Kumanoya et al. | 365/207 |
| 4,973,864 | 11/1990 | Nogami | 307/530 |
| 4,980,863 | 12/1990 | Ogihara | 365/205 |
| 4,980,864 | 12/1990 | Fukuhama et al. | 365/206 |
| 4,991,142 | 2/1991 | Wang | 365/208 |
| 5,274,598 | 12/1993 | Fujii et al. | 365/205 |

OTHER PUBLICATIONS

"A 23-ns 1-Mb BiCMOS DRAM" by Goro Kisukawa, Kazumasa Yanagisawa, Yutaka Kobayashi, et al., *IEEE Journal of Solid-State Circuits*, vol. 25, No. 5, Oct. 1990, pp. 1102–1108.

"An Experimental 1.5-V 64-Mb DRAM" by Yoshinobu Nakagome, Hitoshi Tanaka, Kan Takeuchi, et al., *IEEE Journal of Solid-State Circuits*, vol. 26, No. 4, Apr. 1991, pp. 465–470.

"A Block-Oriented RAM with Half-Sized DRAM Cell and Quasi-Folded Data-Line Architecture" by Katsutaka Kumura, Takeshi Sakata, Klyoo Itoh, et al., *IEEE Journal of Solid-State Circuits*, vol. 26, No. 11, Nov. 1991, pp. 1511–1517.

"A Circuit Technology for Sub-10-ns ECL 4-Mb BiCMOS DRAM's" by Takayuki Kawahara, Yoshiki Kawajiri, Goro Kitsukawa, et al., *IEEE Journal of Solid-State Circuits*, vol. 26, No. 11, Nov. 1991, pp. 1530–1536.

"A 17ns 4Mb BiCMOS DRAM" by Hitoshi Miwa, Shoji

(List continued on next page.)

*Primary Examiner*—David C. Nelms
*Assistant Examiner*—Son Dinh
*Attorney, Agent, or Firm*—Gregory M. Howison

[57] ABSTRACT

A preamp/driver circuit (18) is disclosed which is operable to interface a Bit Line (14) with a Data Line (20). The Bit Line (14) has a plurality of memory cells associated therewith which are selectable by Word Lines. The preamp/driver (18) decouples the Bit Line (14) from the Data Line (20) and drives Data Line (20) from a separate source. The preamp/driver (18) is comprised of a depletion transistor (22) that has the gate thereof connected to the Bit Line (14) and drives a source follower (26). The source follower (26) drives the Data Line (20) from the supply potential. The system is operable during a restore operation to write back to the Bit Line (14) from the Data Line (20) through a Write transistor (28). The restore operation is effected with a restore amplifier with the Read operation effected through a separate sensing device that converts the voltage on the Data Lines to full logic potentials.

25 Claims, 8 Drawing Sheets

OTHER PUBLICATIONS

Wada, Yuji Yokoyama, et al., *1991 IEEE International Solid–State Circuits Conference,* pp. 56–57.

"a 17ns 4Mb CMOS DRAM Using Direct Bit–Line Sensing Technique" by Takeshi Nagai, Kenji Numata, Masaki Ogihara, et al., *1991 IEEE International Solid–State Circuits Conference,* pp. 58–59.

"A Block–Oriented RAM with Half–Sized DRAM Cell and Quasi–Folded Data–Line Architecture" by Katsutaka Kimura, Takeshi Sakata, Klyoo Itoh, et al., *1991 IEEE International Solid–State Circuits Conference,* pp. 106–107, 297.

"A 64Mb DRAM with Meshed Power Line and Distributed Sense–Amplifier Driver" by Toshio Yamada, Yoshiro Nakata, Junko Hasegawa, et al., *1991 IEEE International Solid–State Circuits Conference,* pp. 108–109.

"A 45ns 64Mb DRAM with a Merged Match–line Test Architecture" by Shigeru Mori, Hiroshi Miyamoto, Yoshikazu Morooka, et al., *1991 IEEE International Solid–State Circuits Conference,* pp. 110–111.

"A 40ns 64Mb DRAM with Current–Sensing Data–Bus Amplifier" by Masao Taguchi, Hiroyoshi Tomita, Toshiya Uchida, et al., *1991 IEEE International Solid–State Circuits Conference,* pp. 112–113.

"A 33ns 64Mb DRAM" by Yukhito Oowaki, Kenji Tsuchida, Yohji Watanabe, et al., *1991 IEEE Solid–State Circuits Conference,* pp. 114–115.

ALTERNATE READ CIRCUIT

DYNAMIC RANDOM ACCESS MEMORY WITH BIT LINE PREAMP/DRIVER

TECHNICAL FIELD OF THE INVENTION

The present invention pertains in general to dynamic random access memories, and more particularly, to a preamp for the Bit Line.

BACKGROUND OF THE INVENTION

Dynamic random access memories came to the forefront of technology in the early 1970's with the advent of the 1-T memory cell. In this type of structure, a memory storage capacitor is provided with a switching element associated therewith to allow connection to a Bit Line. A plurality of these memory cells are arranged in an array of rows and columns. The gates of the switching elements associated with each memory cell are arranged in rows and connected to a common Word Line whereas each of the gates in a given column is operable to selectively connect the associated memory cell to a separate Bit Line. Each of the memory cells has the capacity to store one bit of data as either a logic "1" or a logic "0".

When the data stored in a memory cell is accessed, the capacitor is connected to the associated Bit Line which has a predetermined charge level associated therewith. The connection of this memory cell capacitor to the Bit Line causes a change in the charge stored thereon, due to either addition of charge thereto from the memory capacitor or depletion of charge therefrom by the memory capacitor. A sense amp is typically provided for sensing this change in charge to determine whether the bit stored in the memory cell was a logic "1" or a logic "0". However, as the density of a memory array increases, the number of memory cells per Bit Line increases and, due to the size constraints, the size of the memory cell decreases. Therefore, technology has continuously evolved such that the size and the associated capacity of the memory cell has been reduced, and the relative size of the Bit Line has increased. Therefore, the ratio of the Bit Line capacitance to the memory cell capacitance has increased, thus requiring novel techniques to sense very small charge variations in the capacitance change due to access of a memory cell.

One other aspect that exacerbates the sensing operation is that the Bit Line is typically loaded down with a great deal of capacitive overhead. One major contributor to this overhead is the sense amp itself, since it is typically configured of a cross-coupled sense amp wherein the gate of one of the cross-coupled transistors is directly connected to the Bit Line. The only way to reduce this capacitance is to significantly reduce the size of the transistors involved, but this also effects the speed and other operating parameters.

SUMMARY OF THE INVENTION

The present invention, disclosed and claimed herein, comprises a method and apparatus for accessing one of a plurality of memory cells in a Random Access Memory. A plurality of single transistor memory cells configured in an array are provided, each having a memory capacitor for storing a logic "0" or a logic "1" voltage. An inner Bit Line is provided for access thereof by selected ones of the memory cells. When a memory cell is selected, the voltage on the inner Bit Line is driven to a voltage, depending upon the logic state stored in the memory cell capacitor. An outer Bit Line is provided that is isolated from the inner Bit Line. A Bit Line preamp/driver circuit drives the outer Bit Line from the inner Bit Line such that a source different from the inner Bit Line provides the driving current to the outer Bit Line, such that the voltage on the outer Bit Line is not directly coupled to the inner Bit Line and the inner Bit Line does not specifically couple to the outer Bit Line. The outer Bit Line is driven to either a logic "1" or a logic "0" voltage corresponding to the voltage stored in the accessed memory cell.

In another aspect of the present invention, a Read circuit is provided for distinguishing between a logic "0" and a logic "1" voltage on the outer Bit Line. This voltage is then converted into a full circuit voltage or to a ground voltage, in response to the logic state determined to be on the outer Bit Line. This voltage is utilized to generate the output data signal.

In a further aspect of the present invention, a restore circuit is provided for interfacing with the outer Bit Line. After the access operation, the restore circuit is operable to sense the logic state on the outer Bit Line and drive the voltage on the outer Bit Line to a full logic voltage or to a ground voltage, respectively, during the Restore operation. The Restore circuit is operable to drive the inner Bit Line to substantially the same voltage on the outer Bit Line. The Restore circuitry is comprised of a cross-coupled latch having first and second sense nodes, with one sense node connected to a reference voltage and the other connected to the outer Bit Line. During a Restore operation, the latch is operable to drive the outer Bit Line to a full logic potential if the voltage on the outer Bit Line is greater than the reference voltage, and to ground if the voltage on the outer Bit Line is less than the reference voltage. A Write device is provided for selectively connecting the outer Bit Line to the inner Bit Line during the Restore operation to drive the inner Bit Line from the outer Bit Line.

In a yet further aspect of the present invention, the Bit Line is precharged to a predetermined voltage with the preamp/driver circuit operable to shift the voltage on the outer Bit Line to a voltage higher than that on the inner Bit Line for at least one logic state stored in the accessed memory cell. In the preferred embodiment, the precharge voltage can be either ground or one half of the full circuit potential. The outer Bit Line is also precharged to a predetermined voltage level, with the difference between the voltage on the inner Bit Line and the voltage to which the outer Bit Line is driven to for the highest voltage on the inner Bit Line substantially equal to the precharge voltage on the outer Bit Line.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
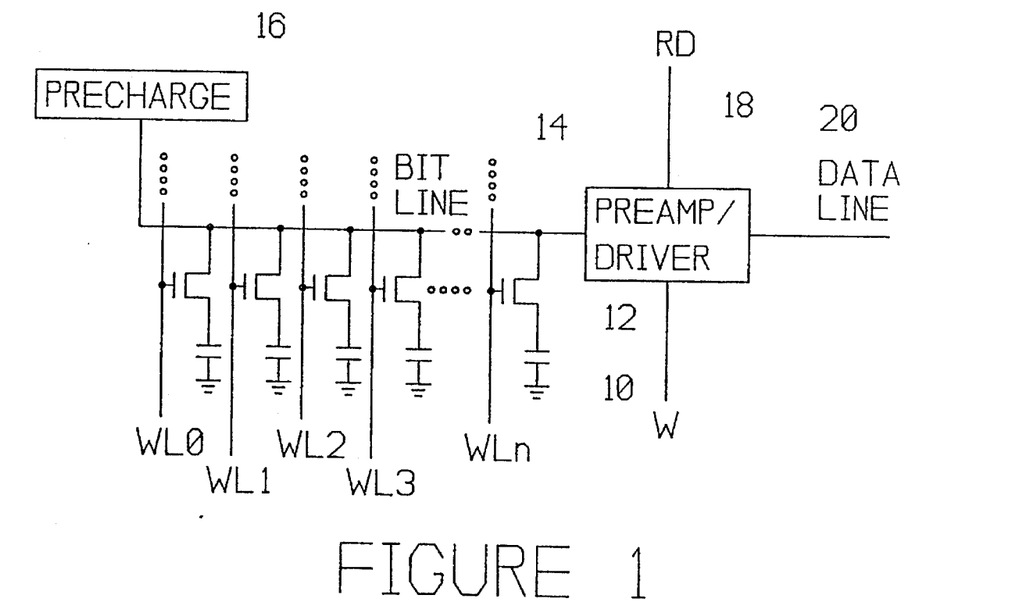
FIG. 1 illustrates a block diagram of a single Bit Line and associated memory cells connected to the preamp/driver.

Referring now to FIG. 1, there is illustrated a schematic diagram of one Bit Line, its associated memory cells and the preamp/driver of the present invention. A plurality of memory cells are illustrated, each comprising a memory cell capacitor 10 and a switching transistor 12. These utilize conventional construction as that utilized in typical 1-T memory cells. Each of the transistors 12 and associated memory cell capacitors 10 are associated with a single column and, therefore, have one side of the source/drain path thereof connected to a single Bit Line 14. The gates of the transistors 12 are each connected to separate Word Lines $WL_0$ through $WL_N$, each associated with a different row of memory cells in the array. A precharge circuit 16 is provided that is operable to provide a precharge voltage to the Bit Line 14 during the precharge cycle and, during the active cycle, a preamp/driver circuit 18 is provided for interfacing with a Data Line 20.

In operation, the memory cell capacitors 10 are typically isolated from the Bit Lines 14 by turning off the associated switching transistors 12 during the non-active cycle. During the active cycle, a read operation is performed which is typically a destructive operation, i.e., the ability to detect the logic level in the cell is destroyed. Therefore, after a read operation, a restore operation is performed to restore the charge in the memory cell capacitor 10 to a full charge when a logic "1" is stored therein, or to a zero charge when a logic "0" is stored therein. After the restore operation, the system is again cycled into the non-active cycle during which precharge operations are performed.

In the system of FIG. 1, the precharge circuit 16 is operable only during the non-active cycle and, during the active cycle, one of the rows of memory cells is selected by activating the appropriate Word Line. At this time, the Bit Line has the selected memory cell capacitor 10 connected thereto and the charge on the Bit Line 14 is affected. The preamp/driver 18 is then placed in the read mode and the voltage on Bit Line 14 is utilized to "drive" the Data Line 20, it being noted that the preamp/driver 18 provides an isolated driving function that maintains the Bit Line 14 isolated from the Data Line 20 and provides a separate drive to Data Line 20. Therefore, as will be described in more detail hereinbelow, the capacitance of the Data Line and all the associated peripheral circuitry is not connected to the Bit Line 14. By isolating the capacitance of the Data Line 20 from the Bit Line 14, the ratio of the Bit Line capacitance to the memory cell capacitance 10 can be reduced. For example, the Bit Line capacitance associated with 64 memory cells on a Bit Line could be as low as 70 femptofarads (fF) with the memory cell capacitor being approximately 35 fF. In conventional systems, this ratio can be as high as five to one or eight to one. The preamp/driver 18 is controlled by a Read operation during the access operation and, during a later restore time, a Write operation allows writing of data from the Data Line 20 back to the Bit Line 14 and the associated memory cell capacitor 10 through the associated switch 12.

Figure 2:
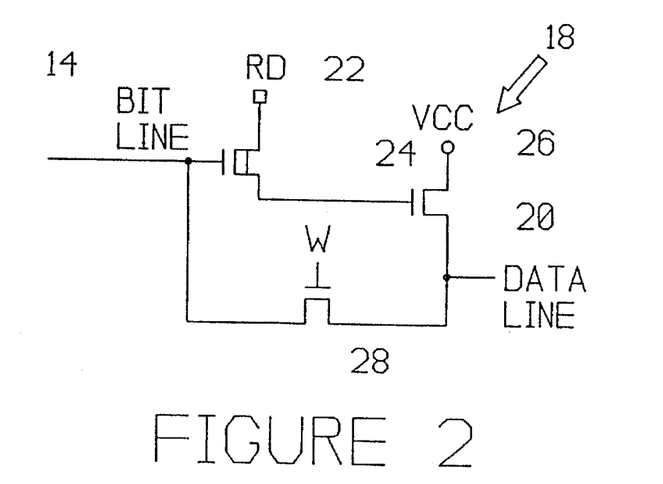
FIG. 2 illustrates a schematic diagram of the preamp/driver.

Referring now to FIG. 2, there is illustrated a schematic diagram of the preamp/driver 18. The preamp/driver 18 is comprised of a depletion transistor 22 that has the drain thereof connected to the Read signal (RD) and the source thereof connected to a node 24. The gate of the depletion transistor 22 is connected to the Bit Line 14. The node 24 is connected to the gate of an n-channel enhancement transistor 26, the drain thereof connected to $V_{CC}$ or lower voltage, and the source thereof connected to the Data Line 20. The write operation is controlled by an n-channel enhancement transistor 28, the source/drain path thereof connected between the Data Line 20 and the Bit Line 14 and the gate thereof connected to the Write signal (W).

In operation, it can be seen that the depletion transistor 22 has a negative threshold. Therefore, the voltage on the Bit Line 14 will be reflected in a voltage on node 24 that is higher by a value equal to the threshold of the depletion transistor 22. The voltage on the Data Line 20 will be lower than the voltage on node 24, the gate of transistor 26, by value equal to the threshold voltage ($V_t$) of transistor 26. The equation for the voltage relationship between Bit Line 14 and Data Line 20 will be as follows:

$$V_{DL}=V_{BL}+|V_{tD}|-V_{tE} \tag{1}$$

where:

$V_{DL}$ is the voltage on the Data Line $V_{BL}$ is the voltage on the Bit Line $V_{tD}$ is the threshold voltage of the depletion device; and $V_{TE}$ is the threshold of the enhancement device.

It can be seen from the above equation that the voltage on the Data Line 20 can actually be higher than that on the Bit Line 14, depending upon the threshold voltage of the depletion device 22. Exemplary voltages for the operation of the preamp/driver 18 would be as follows:

Assume that the Bit Line were charged to the $V_{CC}/2$ where $V_{CC}$ equals four volts. For a logic voltage stored on the memory cell capacitor 10, the voltage would be approximately 3.3 volts. Therefore, the capacitor would pull the precharged Bit Line 14 from its precharge level of 2.0 volts to a level of 2.2 volts. The depletion transistor 22 with a threshold voltage of −1.2 volts would result in a voltage increase on node 24 of 1.2 volts or a voltage of 3.4 volts being impressed upon node 24. The enhancement transistor 26 with a threshold voltage of 0.6 volts would result in a voltage of 2.8 volts being impressed on Data Line 20, with the drive to Data Line 20 being provided from $V_{CC}$ through the source/drain path of transistor 26 and not from the Bit Line 14.

Figure 3:
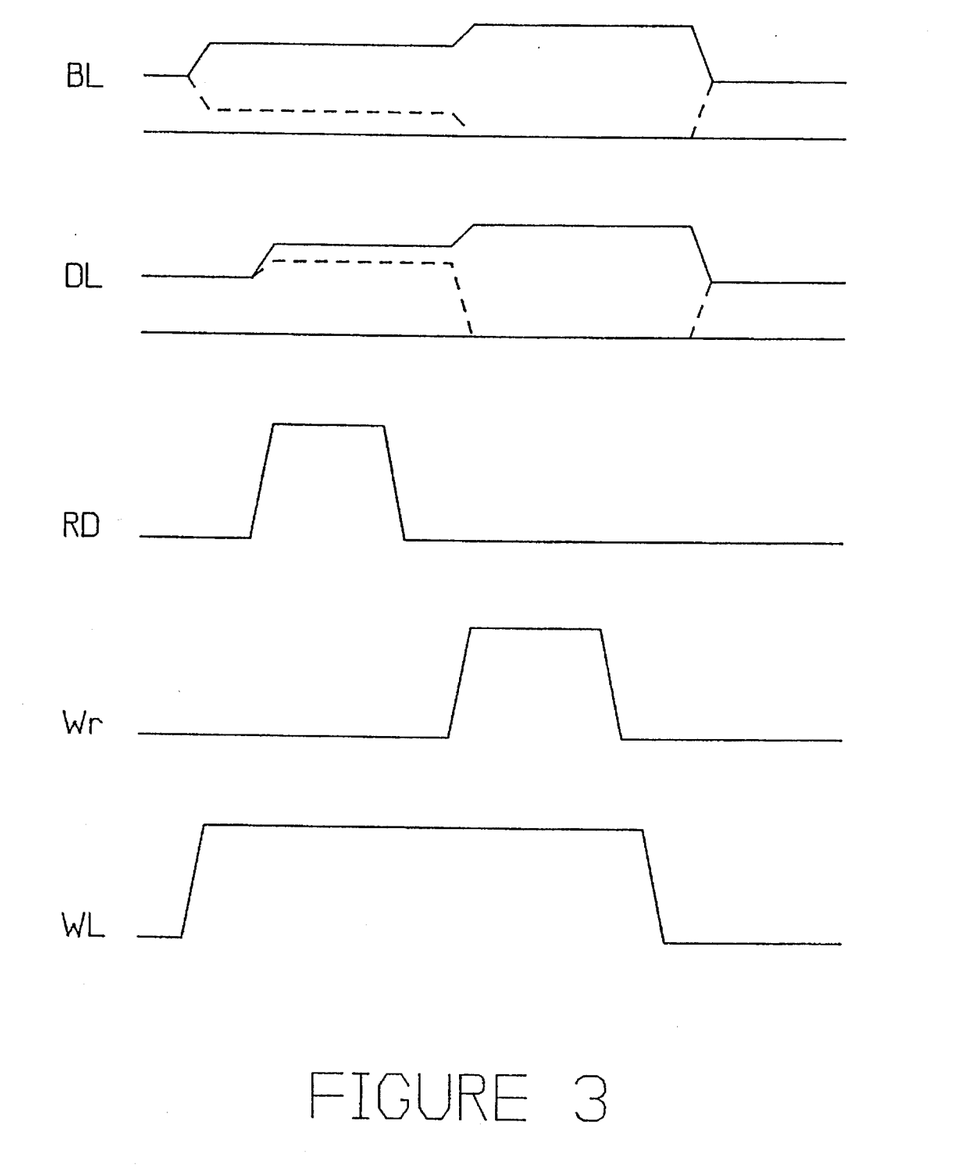
FIG. 3 illustrates a timing diagram of the operation of the preamp/driver of FIG. 2.

Referring now to FIG. 3, there is illustrated a timing diagram for the preamp/driver 18 of FIG. 2. The Bit Line is initially charged to a predetermined voltage of $V_{CC}/2$, as indicated by the portion 30 in the curve labeled BL. At a point in time labeled 32, the Read signal RD is then raised high for a short duration of time, this short duration of time being sufficient to drive the Data Line 20 to the appropriate voltage. At this time, a logic "1", represented in the solid line, and a logic 0, represented in the phantom line, are illustrated as changing the voltage from the level at portion 30. For a logic "1", the voltage changes to a higher level at the portion 34 on the BL trace and, for a logic "0", at the portion 36 on the BL trace. The Data Line represented by the DL trace changes from a precharge voltage at a portion 38 to a higher voltage level, as defined by equation "1", at portion 40 for a logic "1", and to a higher level at portion 42 for a logic "0". These levels are maintained until the restore operation occurs, which is initiated upon receiving a Restore signal. This occurs at a point 44 on the BL trace, which has an associated response at a point 46 on the DL trace. The low logic level on the DL trace is pulled to a full low logic level and the high logic level is pulled to a full $V_{CC}$ level on the DL trace and also on the BL trace. After the restore operation is complete, the Word Line again goes low and the precharge cycle is entered.

It can be seen from the operation of the preamp/driver 18 that a relatively rapid stabilization of the Data Line has occurred with relatively small changes in the Bit Line voltage. Additionally, this occurs at a much faster rate without consideration of the actual Bit Line capacitance and Data Line capacitance, as these are isolated. Further, as will be described in more detail hereinbelow, the Bit Line precharge can be varied from as low as zero volts to higher than $V_{cc}/2$.

Figure 4:
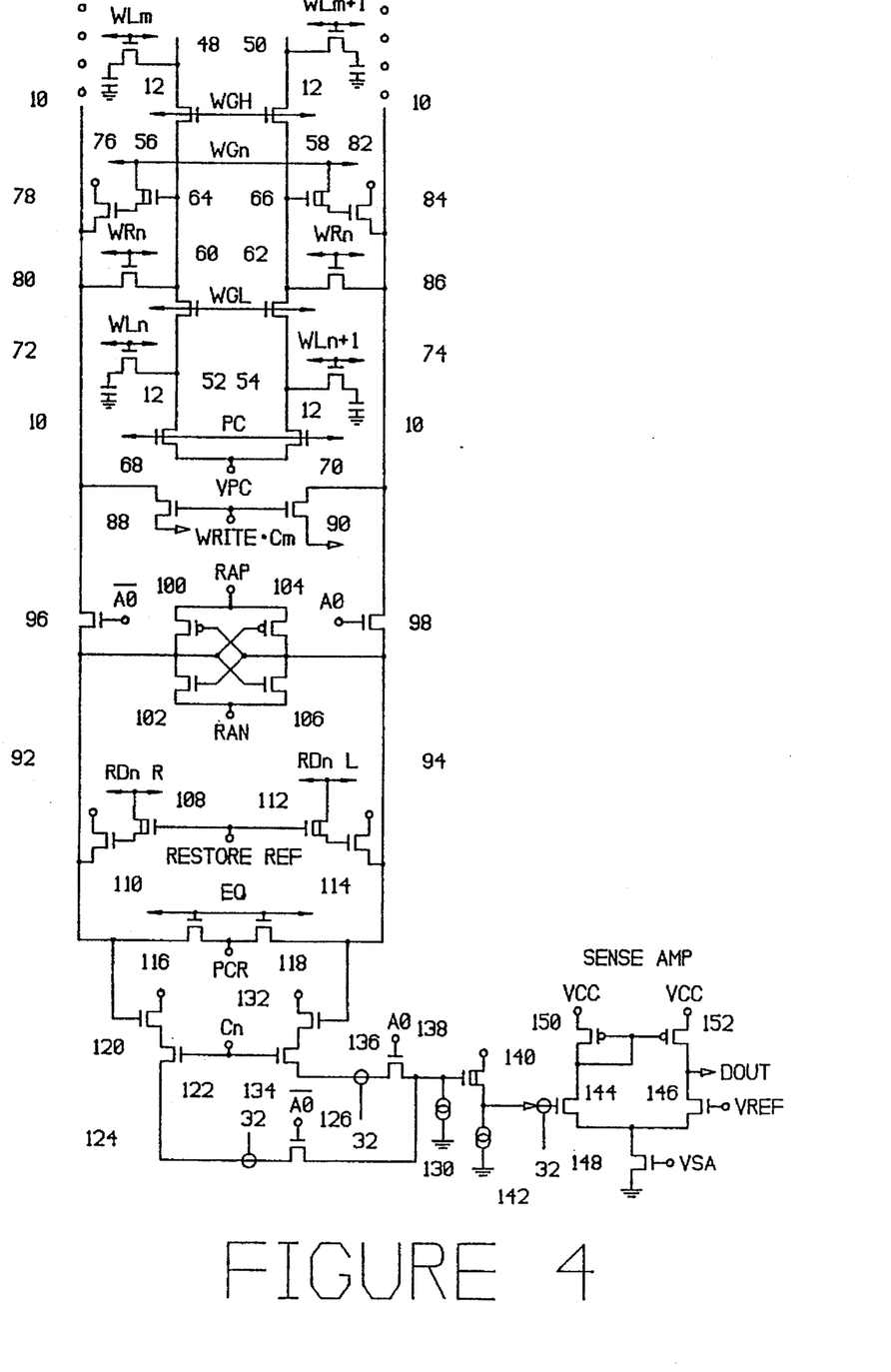
FIG. 4 illustrates a schematic diagram of one column of memory cells and associated peripheral circuitry for operation thereof.

Referring now to FIG. 4, there is illustrated a schematic diagram of a single column of memory cells in a folded Bit Line architecture and the associated peripheral circuitry. This configuration is illustrated as being a shared system wherein two portions of the memory array share a given set of preamp/drivers. There are two selectable arrays, a first array comprised of Bit Lines 48 and 50 and a second array comprised of Bit Lines 52 and 54, it being understood that Bit Lines 48 and 52 comprise the uninverted Bit Line, and Bit Lines 50 and 54 comprise the inverted Bit Lines or Bit Line-Bar. Each of the Bit Line pairs is selectable by a separate set of transistors with Bit Lines 48 and 50 selected by transistors 56 and 58, respectively, and Bit Lines 52 and 54 selected by transistors 60 and 62, respectively. A signal WGH is connected to the gates of transistors 56 and 58 such that when the voltage to the gates of transistors 56 and 58 is high, the source/drain path of transistor 56 is operable to connect Bit Line 48 to an intermediate Bit Line 64 and the source/drain path of transistor 58 is operable to connect Bit Line 52 to an intermediate Bit Line 66. Intermediate Bit Lines 64 and 66 comprise an output Bit Line pair. Similarly, transistors 60 and 62 have the gates thereof connected to a voltage WGL which, when activated, is operable to connect the source/drain path of transistor 60 between Bit Line 52 and intermediate Bit Line 64 and the source/drain path of transistor 62 between Bit Line 54 and intermediate Bit Line 64. Each of the Bit Line pairs 48, 50 and 52–54 have associated therewith 64 memory cells comprised of a switching transistor 12 and a memory capacitor 10. Each of the memory cells associated with Bit Lines pairs 52, 54 are activated by a Word Line $WL_n$ or a Word Line $WL_{n+1}$, respectively, and each of the memory cells associated with Bit Line pair 48, 50 are controlled by a Word Line signal $WL_m$ or a Word Line $WL_{m+1}$, respectively.

Each of the pairs of Bit Lines 48 and 50, and 52 and 54 have precharge circuitry associated therewith which is disposed at the opposite end of the Bit Line pairs from the intermediate Bit Lines 64 and 66. The precharge circuitry for Bit Lines 52 and 54 is illustrated as being two transistors 68 and 70 with the source/drain path of transistor 68 connected between Bit Line 52 and a precharge voltage VPC, and the source/drain path of transistor 70 being connected between Bit Line 54 and the voltage VPC, the gates of transistors 68 and 70 connected to a precharge signal PC.

Intermediate Bit Line 64 is operable to be connected to a Data Line 72 through a preamp/driver circuit, and intermediate Bit Line 66 is operable to be connected to a Data Line 74 through a preamp/driver circuit, the Data Line 72 and Data Line 74 comprising a Data Line pair, with Data Line 72 conventionally referred to as DL and the Data Line 74 conventionally referred to as Data Line-Bar. The preamp/driver circuit associated with intermediate Bit Line 64 and Data Line 72 is comprised of a depletion transistor 76 and an enhancement transistor 78 configured similar to that of FIG. 2. Similarly, the Write transistor is comprised of an n-channel transistor 80 connected between Data Line 72 and intermediate Bit Line 64 and a gate thereof connected to a Write Signal WRn. Similarly, the preamp/driver circuit associated with intermediate Bit Line 66 and Data Line 74 is comprised of a depletion transistor 82 and an enhancement transistor 84 configured similar to that of FIG. 2. A Write transistor is comprised of an n-channel transistor 86 having the source/drain path thereof connected between intermediate Bit Line 66 and Data Line 74, with the gate thereof connected to a write signal WRn'.

The Data Lines have a Write circuit connected thereto which is comprised of an n-channel transistor 88 having the source/drain path thereof connected between Data Line 72 and a Data-In terminal, and an n-channel transistor 90 having the source/drain path thereof connected between the Data Line 74 and a Data-In Bar terminal. The gates of transistors 88 and 90 are connected to a signal WRITE•$C_m$ for the Write operation.

Each of the Data Lines 72 and 74 are connected to output Data Lines 92 and 94 by isolation transistors 96 and 98, respectively. Transistors 96 and 98 each are connected between their respective Data Lines 72 and 92 and 74 and 94, respectively, through the source/drain paths thereof. Transistor 96 has a gate thereof controlled by the signal A0 and transistor 98 has the gate thereof controlled by the signal A0-Bar, these representing address input lines with one bit of the address input operable to select a given one of the array sections.

A restore amplifier is provided which is configured with cross-coupled MOS transistors with a p-channel transistor 100 and an n-channel transistor 102 connected in series between a signal RAP and a signal RAN with the common source/drain node thereof connected to the Data Line 92. The gates of transistors 100 and 102 are connected to the Data Line 94. A p-channel transistor 104 and an n-channel transistor 106 are connected in series between the signal RAP and the signal RAN with the common source/drain node thereof connected to the Data Line 94. The gates of transistors 104 and 106 are connected to the Data Line 92. The signals RAP and RAN are initially disposed at a mid-level voltage, i.e., $V_{cc}/2$, and, upon a restore operation, are separated such that RAP is pulled high and RAN is pulled low.

In operation, only one of the Data Lines 72 or 74 is selected by transistors 96 or 98, respectively, for connection to their respective Data Lines 92 and 94. The other of the Data Lines 92 or 94 is connected to a restore reference voltage. This restore reference voltage is generated by one of two preamp/driver circuits. The preamp/driver circuit associated with Data Line 92 is comprised of a depletion transistor 108 and an enhancement transistor 110 connected similar to the structure of FIG. 2 with the source of transistor 110 connected to Data Line 92 and the gate of transistor 108 connected to a restore reference voltage. The drain of transistor 108 is connected to a signal RDn R. Similarly, the preamp/driver circuit associated with Data Line 94 is comprised of a depletion transistor 112 and an enhancement transistor 114 configured similar to the structure of FIG. 2. The source of transistor 114 is connected to the Data Line 94, the gate of transistor 112 is connected to the restore reference voltage and the drain of transistor 112 is connected to a signal RDn L. The signal RDn L is activated whenever A0 is activated and, conversely, the signal RDn R is activated whenever the signal A0 bar is activated, such that the opposite side of the restore amp has a reference voltage disposed thereon.

The Data Lines 92 and 94 are initially precharged through transistors 116 and 118, which have the source/drain path thereof connected between the precharge voltage PCR and the Data Lines 92 and 94, respectively. The gates of transistors 116 and 118 are connected to the precharge signal PC.

The Data Line 92 is connected to the gate of an n-channel transistor 120, the source/drain path thereof connected between $V_{CC}$ and the one side of the source/drain path of an n-channel transistor 122. The opposite side of the source/drain path of transistor 122 is connected to one side of the source/drain path of a transistor 126. The node 124 is connected to thirty-two of the transistors 122, each associated with a Data Line 92 and one-half of a folded Bit Line column. Transistor 122 is selected with a column select line $C_N$ on the gate thereof. Transistor 126 is selected with the A0 signal on the gate thereof, with the other side of the source/drain path thereof connected to an output node 128 which is connected to ground through a current source 130.

The Data Line 94 is connected in a similar manner to the node 128 as was the Data Line 92. The Data Line 94 is connected to the gate of an n-channel transistor 132, the source/drain path thereof connected between $V_{CC}$ and one side of the source/drain path of an n-channel transistor 134. The other side of the n-channel transistor 134 is connected to a node 136, which is connected to one side of the source/drain path of a transistor 138. Transistor 138 has the other side of the source/drain path thereof connected to the node 128 and it is controlled by the signal A0-Bar. Transistor 134 is selected by the column select signal $C_N$ on the gate thereof, as there are thirty-two transistors 134 connected to the node 136, each associated with one of thirty-two column halves. Therefore, the column select signal $C_N$ is operable to select one of thirty-two folded Bit Line columns, with the address bit A0 operable to select one-half of the column, and the signals WGH and WGL are operable to select one of the respective arrays of 64 memory cells.

The output node 128 is connected to the gate of a depletion transistor 140, the drain thereof connected to $V_{CC}$ and the source thereof connected through a current source 142 to ground and also to the input of a sense amp. The sense amp is a differential amplifier comprised of two differential n-channel transistors 144 and 146 having common sources connected to one side of the source/drain path of transistor 148, the other side of which is connected to ground. The gate of transistor 148 is connected to a voltage signal VSA. Transistor 144 has the gate thereof connected to the source of transistor 140 and transistor 146 has the gate thereof connected to a reference voltage VREF. A p-channel transistor 150 has the source/drain path thereof connected between $V_{CC}$ and the drain of transistor 144 with the gate of transistor 150 connected to the gate of a load transistor 152, the source/drain path thereof connected between $V_{CC}$ and the drain of transistor 146. The drain of transistor 146 comprises the DOUT signal.

Figure 4A:
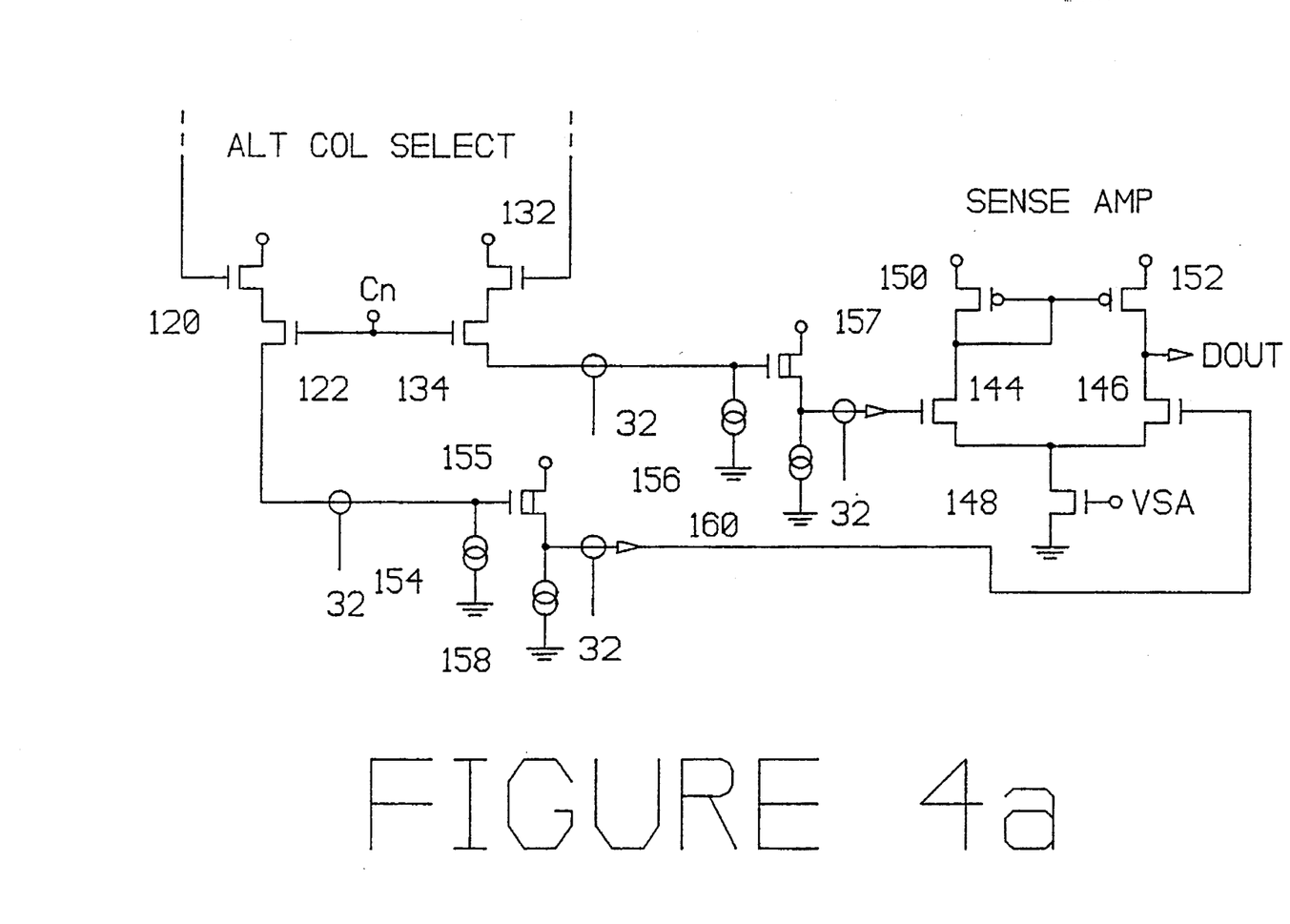
FIG. 4a illustrates an alternate embodiment of the column select circuit of FIG. 4.

An alternate embodiment of the output circuit of FIG. 4 is illustrated in FIG. 4a. In FIG. 4a, the source of transistor 122 is connected through a current source 154 to ground and then also to the gate of a depletion transistor 155. Similarly, the source of transistor 134 is connected through a current source 156 to ground and also to the gate of a depletion transistor 157. The drain of transistor 155 is connected to $V_{CC}$ and the source thereof connected through a current source 158 to ground and also to the gate of transistor 146 in the sense amp. Similarly, the drain of transistor 157 is connected to $V_{CC}$ and the source thereof is connected through a current source 160 to ground and also to the gate of the transistor 144 in the sense amp.

Figure 5:
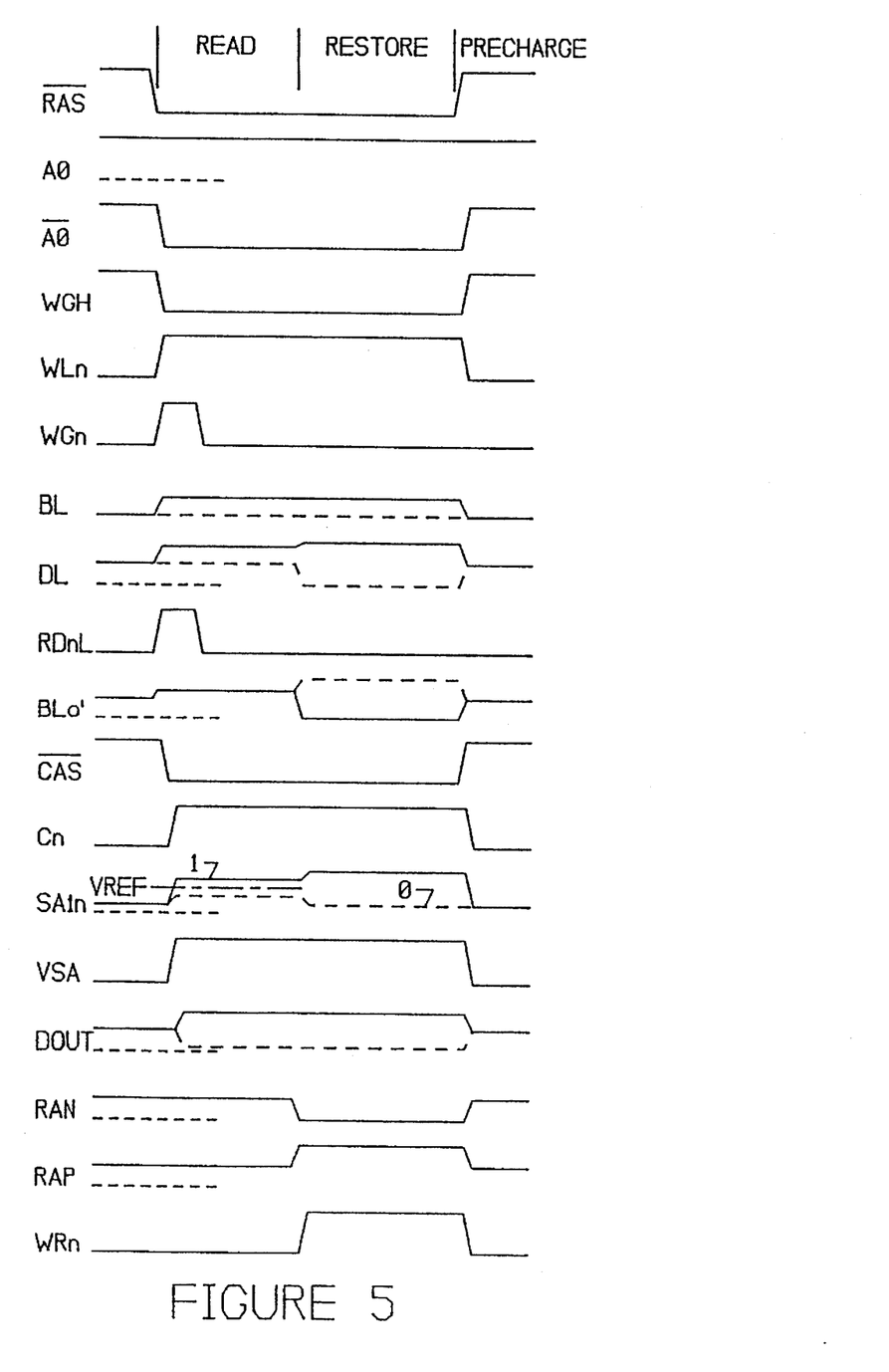
FIG. 5 illustrates a timing diagram for the array of FIG. 4.

Referring now to FIG. 5, there is illustrated timing diagrams for the operation of the embodiment of FIG. 4. It can be seen that when the Row Address Strobe Bar (RAS-Bar) goes low, this initiates a Read operation, followed by a restore operation. When RAS-Bar goes high this initiates a precharge cycle. Later, the Column Address Strobe (CAS-Bar) goes low to select the column $C_n$. In this example, the address bit A0 is high and the address bit A0-Bar is low. The lower array of transistors associated with Bit Lines 52 and 54 is selected by raising WGL high and WGH low, they being the inverse of each other. The Word Line goes high very shortly after RAS-Bar goes low. The read signal $WG_n$ goes high for a short duration of time at least after the Word Line goes high, the Word Line associated with one of the cells on Bit Line 52. The Bit Line is initially precharged to a zero voltage. Two cases are illustrated, one where logic "1" is stored in the memory cell, i.e., corresponding to a full logic voltage stored therein, and the second where a logic "0" is stored in the cell, i.e., where the voltage is zero. The logic "0" case is illustrated with a dotted line and the logic "1" state is illustrated with a solid line. In the logic "1" case, the connection of the memory cell capacitor to the Bit Line 52 raises the Bit Line 52 to a voltage higher than ground, whereas the logic "0" state maintains the Bit Line at a zero voltage. The Data Line is initially precharged to a mid-level voltage of $V_{CC}/2$ and then rises to a higher voltage level upon activation of the read signal $WG_n$. It is important to know that this occurs from a Bit Line precharge of zero voltage, which conventional systems do not accomplish, this being one important aspect of the present invention. For logic "0", the Data Line 92 does not substantially move, as transistor 78 is not turned on. This effectively initiates the sense operation, it being noted that the drive for the Data Line 92 is provided by the transistor 78 and not provided from the Bit Line 52 or intermediate Bit Line 64.

In designing the threshold voltages of the depletion transistors 76 and 82, and the threshold voltages of the enhancement transistors 78 and 84, it is important to know the starting parameters. In the present example, the Data Line is charged to $V_{CC}/2$. The threshold voltage of the depletion transistor and the enhancement transistor combine to equal voltage of $V_{CC}/2$ such that whenever the Bit Line is equal to a 0 voltage, i.e., that existing when a logic "0" is placed on the capacitor, the voltage on the Data Line will be equal to $V_{CC}/2$, or there will be no change. Therefore, the delta voltage between a logic "0" and a full logic "1" on the Bit Line will result in the same delta voltage on the Data Line between the logic "0" and the logic "1". Further, it can be seen that the Data Line could be precharged to zero, as well as the Bit Line. It is then only necessary to design the reference $V_{REF}$ on the output sense amplifier such that it is between the voltage existing on the data line for a logic "1" and that existing for a logic "0". Alternately, the Bit Line could be charged to a voltage of $V_{CC}/2$ and the threshold voltage of a depletion device and the enhancement device designed such that the difference in voltage between a full logic "1" and a logic "0" is between ground and the full $V_{CC}$ voltage on the data line.

Concurrent with the sensing operation, the restore reference is applied to the Data Line 94 and to one side of the restore amplifier on the gates of transistors 100 and 102.

Again, it should be noted that the gates of transistors 104 and 106 are connected to Data Line 92 and are driven during the sensing operation and also connected to the common source/drain connection of transistors 100 and 102. This capacitive loading in previous systems including all the Read Out circuitry was born by the Bit Line, whereas in the present invention, it is driven by the transistor 78 and isolated from intermediate Bit Line 64. The Data Line 94 is referred to as DL', which voltage level goes to the reference voltage level on the non-sensing side of the restore amplifier.

During a restore operation, the signal RAP is raised from a mid-level voltage to a full logic voltage and the signal RAN is lowered from the mid-level voltage to ground, thus allowing the restore sense amplifier to latch and pull Data Line 92 to a full logic level if a logic "1" was stored in the memory cell and to a low or ground voltage if a logic "0" was stored in the memory cell. It should be noted that the restore reference voltage on Data Line 94 is disposed midway between the initial precharge voltage on Data Line 92 and that present when a logic "1"0 is sensed thereon. Therefore, a logic "0" would allow the Data Line 92 to remain at the precharge voltage with a logic "1" pulling it up to a higher level. The restore amplifier would compare these two voltages with the reference voltage and pull the Data Line 92 high or low depending upon the relative voltages.

The transistors 120, 122 and 126 operate as a series configured source follower utilizing the current source 130 to establish a voltage in the gate of the depletion transistor 140. The voltage on the node 128 is one threshold voltages below the voltage on the Data Line 92 which is then increased by the threshold voltage of the depletion transistor 140 for input to the sense amp, this threshold voltage offsetting the one threshold voltage drop. The use of the depletion transistor 140 also allows precharge of the Data Lines 72 and 74 to a ground voltage, provided transistors 120 and 132 are depletion transistors also. The reference voltage VREF on the sense amp is set to be midway between that present on the other input for a logic "1" and logic "0". The voltage VSA is typically turned on during a Read mode. During the restore operation, the signal WRN is activated after RAN and RAP have been separated from the precharge voltage, such that the logic state is then stored back into the amplifier selected memory cell prior to removal of the voltage therefrom.

Figure 6:
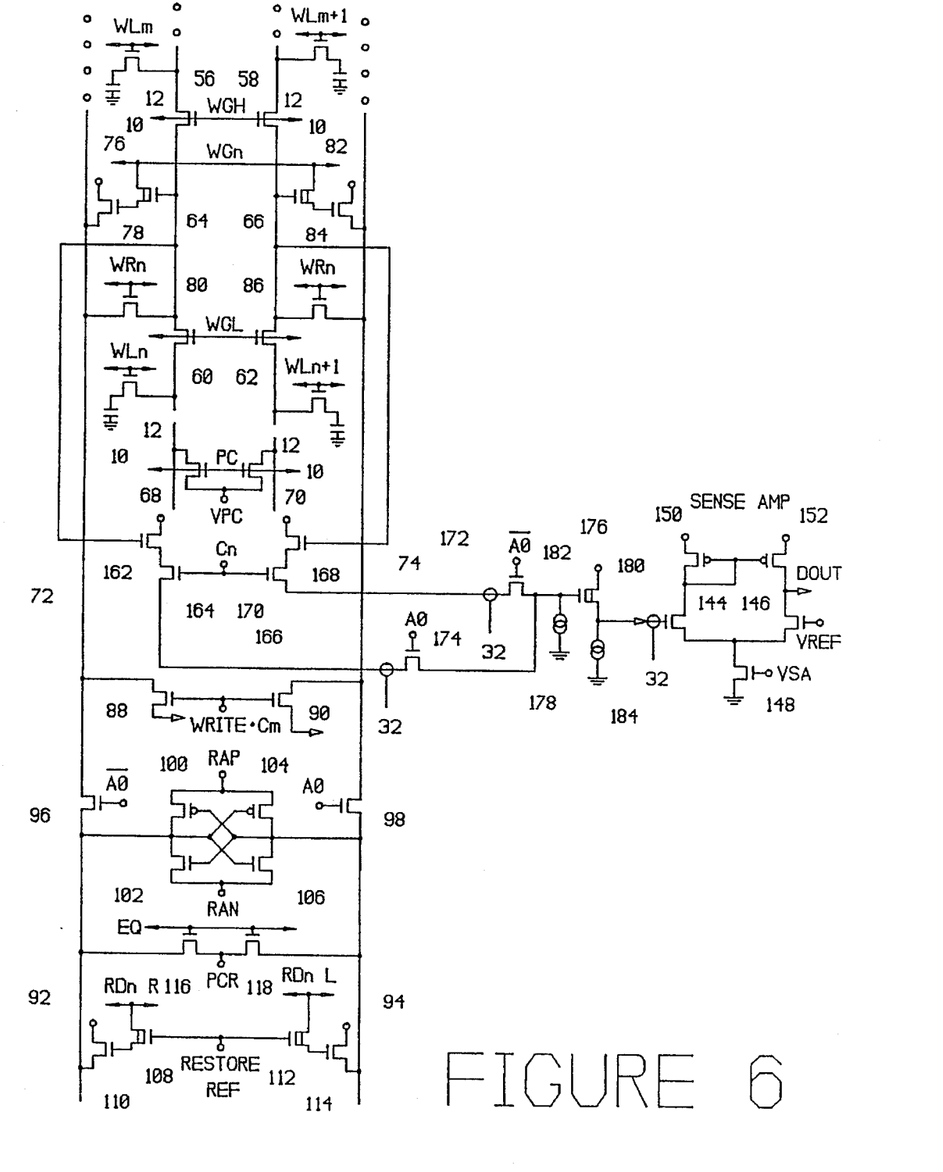
FIG. 6 illustrates an alternate embodiment of the array of FIG. 4 illustrating a read operation that is isolated from the restore operation.

Referring now to FIG. 6, there is illustrated an alternate embodiment of the present invention illustrating the situation wherein the read operation is isolated from the restore operation. The embodiment of FIG. 6 provides two series connected n-channel transistors 162 and 164 connected between $V_{CC}$ and a node 166, there being thirty-two series connected transistors 162 and 164 connected to the node 166. The gate of transistor 162 is connected to the intermediate Bit Line 64 and again transistor 164 is connected to the column select signal $C_N$. Similarly, two series connected n-channel transistors 168 and 170 are connected between $V_{CC}$ and a node 172, there being thirty-two series connected transistors 168 and 170 connected to node 172 representing thirty-two separate folded Bit Line columns. Transistors 162 and 168 are depletion transistors. This allows the intermediate Bit Lines 64 and 66 to be precharged to either $V_{CC}/2$ or ground.

The gate of transistor 168 is connected to intermediate Bit Line 66 and the gate of transistor 170 connected to the column select line $C_N$. The node 166 is connected through the source/drain path of an n-channel transistor 174 to node 176, node 176 connected to ground through current source 178 and also to the gate of a depletion transistor 180.

Similarly, node 172 is connected through the source/drain path of an n-channel transistor 182 to the node 176, the gates of transistors 174 and 182 connected to the address bit A0 and A0-Bar, respectively. Depletion transistor 180 has the source/drain path thereof connected on one side to $V_{CC}$ and on the other side thereof through a current source 184 to ground and to the input of the sense amp.

In operation, it can be seen that the Read operation is completely isolated from the restore operation associated with Data Lines 92 and 94. This is achieved due to the fact that the restore operation is isolated by the preamp/driver circuits disposed between intermediate Bit Lines 64 and 66 and Data Lines 72 and 74, respectively.

Figure 7A:
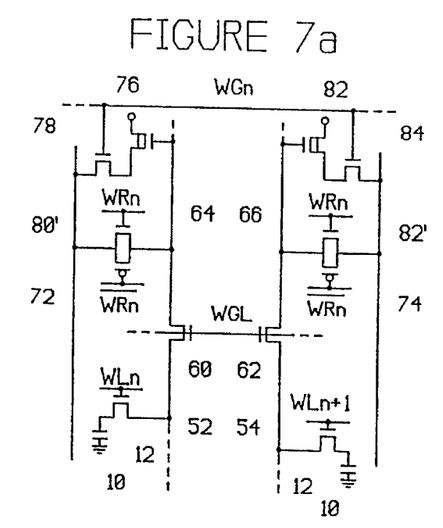
FIGS. 7a–7d illustrate alternate embodiments of the preamp/driver and read circuits.

Referring now to FIGS. 7a–7d, there are illustrated alternate preamp/driver and read circuits. In FIG. 7A, the depletion transistor 76 and the depletion transistor 82 have the sources thereof connected to $V_{CC}$ whereas the enhancement transistors 78 and 84 are configured such that the source/drain path thereof is connected between the respective Data Lines 72 and 74 and the sources of the respective depletion transistor 76 and 82. The gates of transistors 78 and 84 are connected to the read signal $WG_n$. The write transistors 80 and 86 are replaced by two CMOS gates 80' and 82', the CMOS gates comprised of an n-channel transistor and a p-channel transistor having the source/drain paths thereof connected in parallel. In operation, depletion transistor 76 is operable to increase the voltage on the intermediate Bit Line 76 by the threshold voltage of the depletion transistor 76 with the Read signal $WG_n$ operable to turn transistor 78 on, the result being that the voltage on the drain of transistor 78 will be reflected on the source of transistor 78, with the limitation that the source of transistor 78 can be no higher than one threshold voltage below the voltage $WG_n$.

Figure 7B:
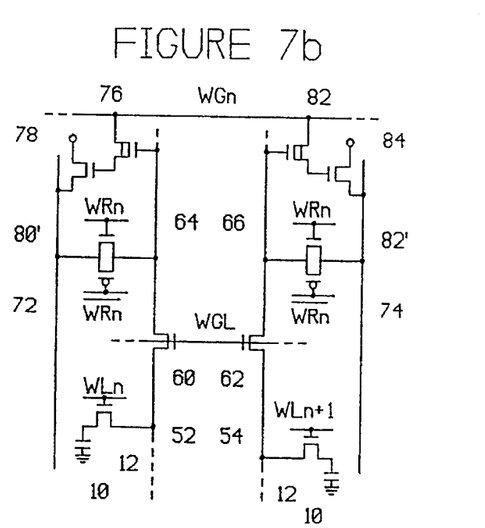

FIG. 7b illustrates a configuration similar to that of FIG. 7a, with the structure of FIG. 2 for the preamp/drivers but with transmission gates.

Figure 7C:
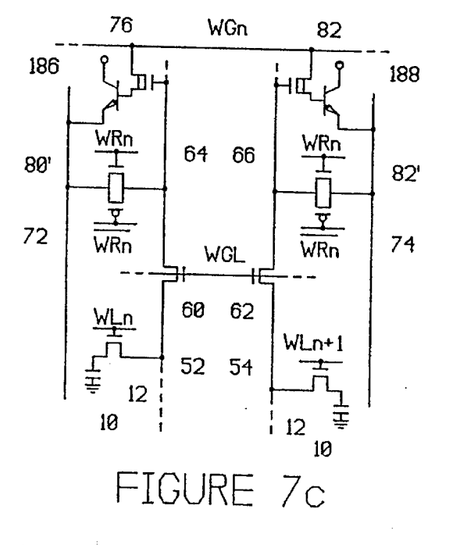

FIG. 7c illustrates an embodiment similar to that of FIG. 4 with the exception that the enhancement transistor 78 is replaced by a bipolar NPN transistor 186 and the enhancement transistor 84 replaced by an bipolar NPN transistor 188. NPN transistor 186 has the emitter thereof connected to the Data Line 72, the collector thereof connected to $V_{CC}$ and the base thereof connected to the source of depletion transistor 76. Similarly, NPN transistor 188 has the emitter thereof connected to Data Line 74, the base thereof connected to the source of depletion transistor 82 and the collector thereof connected to $V_{CC}$. In operation, transistor 186 will provide a much faster drive and a higher current throughput to the Data Lines 72 and 74. In construction, this typically will be facilitated with a BiCMOS construction.

Figure 7D:
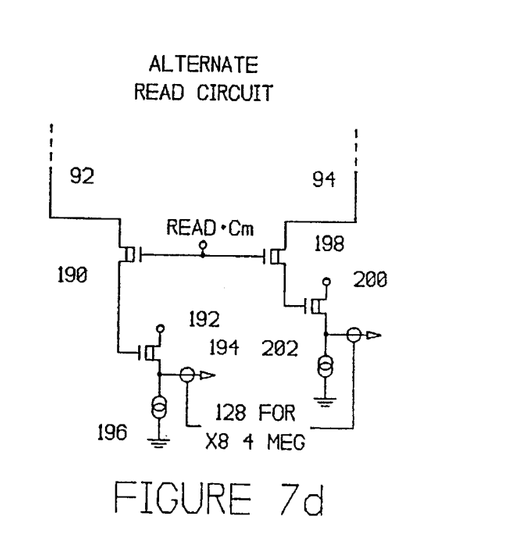

FIG. 7d illustrates an alternate Read circuit connected to the Data Lines 92 and 94. The Data Line 92 is connected to one side of the source/drain path of a depletion transistor 190, the other side of the source/drain path of transistor 190 connected to the gate of a depletion transistor 192. Depletion transistor 192 has a source/drain path thereof connected between $V_{CC}$ and the sense amp input on a node 194 and also through a current source 196 to ground. Similarly, Data Line 94 is connected to one side of the source/drain path of a depletion transistor 198, the other side of which is connected to the gate of a depletion transistor 200. The other source/drain path of depletion transistor 200 is connected between $V_{CC}$ and the input to the sense amp and also to ground through a current source 202 to ground. The gates of the transistors 190 and 198 are connected to a signal READ●$C_M$. In operation, the voltage on the gate of transistor 192 will essentially be the voltage on the Data Line 92, as transistor 190 is normally on, with the exception that the voltage on the gate of transistor 192 cannot be more than one $V_t$ of transistor 190 above the voltage on the gate thereof. The voltage on the node 194 will be one $V_t$ of transistor 192 above the voltage on the gate thereof.

Figure 8:
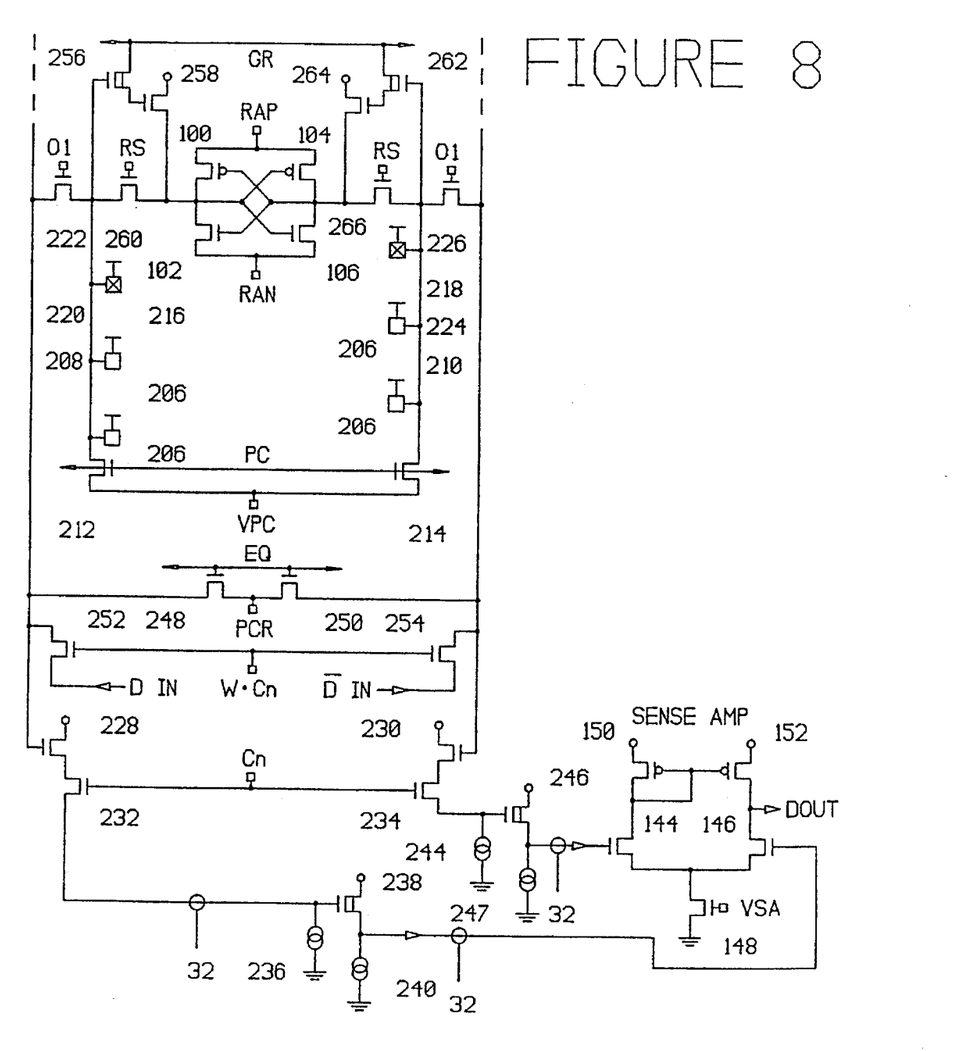
FIG. 8 illustrates an alternate embodiment of the present invention.

Referring now FIG. 8, there is illustrated an alternate embodiment of the present invention. Memory cells 206 are disposed on Bit Line halves 208 and 210, respectively, in a folded Bit Line configuration. Each of the Bit Line halves is precharged with precharge transistors 212 and 214, respectively, which have the source/drain paths thereof connected between the respective Bit Lines 208 and 210 and the voltage VPC. The gates of transistors 212 and 214 are controlled by the PC precharge signal. In addition to the memory cells 206, a dummy cell 216 is associated with Bit Line 208 and a dummy cell 218 is associated with Bit Line 210. The dummy cells 216 and 218 operate in a conventional manner; that is, when one of the memory cells 206 on either of the Bit Lines 208 or 210 is activated, the dummy cell on the opposite Bit Line is activated to provide balance during the sensing operation.

Data accessed on Bit Line 208 is directed to a Data Line 220 through an access transistor 222. Similarly, data accessed by the Bit Line 210 is connected to a Data Line 224 through an access transistor 226, access transistors 224 and 226 controlled by an access signal 01.

The Data Lines 220 and 224 are each connected to the gate of the respective N-channel transistors 228 and 230. The source/drain path of transistor 228 is connected between $V_{CC}$ and one side of the source/drain path of the N-channel transistor 232. Similarly, the source/drain path of transistor 230 is connected between $V_{CC}$ and one side of the source/drain path of an N-channel transistor 234, the gates of transistors 232 and 234 connected to the column address signal $C_n$. The other side of the source/drain path of transistor 232 is connected to ground through a current source 236, and also to the gate of a depletion transistor 238. The source/drain path of transistor 238 is connected on one side to $V_{CC}$, and on the other side to ground through current source 240 and also to the gate of transistor 146 in the sense amp. Similarly, the other side of the source/drain path of transistor 234 is connected to ground through a current source 244 and also to the gate of the depletion transistor 246. One side of the source/drain path of transistor 246 is connected to $V_{CC}$, and the other side is connected through a current source 247 to ground and also to the gate of the transistor 144 in the sense amp.

Both Data Lines 220 and 224 are also connected to an equalizing precharge signal PCR through N-channel transistors 248 and 250, respectively, the gates thereof connected by a signal EQ. Additionally, the Data Line 220 is connected to one side of the source/drain path of an N-channel transistor 252, the other side thereof connected to a Data-In terminal, and the gate thereof connected to a Write signal. The Data Line 224 is connected to one side of the source/drain path of N-channel transistor 254, the other side thereof connected to the Data-In Bar terminal, the gate thereof connected to the Write input signal.

The Restore operation is affected by the Restore sense amplifier, comprised of the transistors 100–106 that are configured in a cross-coupled configuration. The preamp/driver circuitry is utilized to drive the restore amplifier. A depletion transistor 256 and an N-channel enhancement transistor 258 are configured similar to that of FIG. 2 and are connected between the Bit Line 208 and the gates of transistors 104 and 106. An N-channel transistor 260 is connected directly between the Bit Line 208 and the gates of transistors 104 and 106. Similarly, a depletion transistor 262 and an N-channel enhancement transistor 264 are configured similar to the structure of FIG. 2 and connected between the Bit Line 210 and the gates of transistors 100 and 102. An N-channel transistor 266 is connected between the Bit Line 210 and the gates of transistors 100 and 102. Transistors 260 and 266 have the gates thereof controlled by a signal RS. One side of the source/drain path of the depletion transistors 256 and 262 are connected to a signal GR.

Although the preferred embodiment has been described in detail, it should be understood that various changes, substitutions and alterations can be made therein without departing from the spirit and scope of the invention as defined by the appended claims.

What is claimed is:

1. A random access memory, comprising:
   a plurality of single transistor memory cells configured in an array and each having a memory capacitor for storing a logic "0" voltage or a logic "1" voltage;
   an inner Bit Line;
   an access device for selectively connecting one of said memory cells to said inner Bit Line in response to an external access signal such that said memory capacitor can transfer charge to and from said inner Bit Line;
   an outer Bit Line;
   a Bit Line preamp/driver circuit for driving said outer Bit Line from a source different from said inner Bit Line as said access device accesses said memory cell, such that said outer Bit Line is not directly coupled to said inner Bit Line, said outer Bit Line driven toward either a logic "1" voltage or a logic "0" voltage corresponding to the voltage stored in said accessed memory cell; and
   a restore circuit interfaced with said outer Bit Line and operable to sense the logic state on said outer Bit Line and drive the voltage on said outer Bit Line to either a full logic voltage or to a ground voltage, respectively, during a restore operation depending upon whether said logic "1" voltage as said logic "0" voltage is present on said outer Bit Line, said restore circuit operable to drive said inner Bit Line to substantially the same voltage as the outer Bit Line during said restore operation.

2. The memory of claim 1 and further comprising a read circuit for distinguishing between a logic "0" and a logic "1" voltage on said outer Bit Line and converting the voltage on said outer Bit Line to a substantially amplified voltage in response to the logic state determined to be on said outer Bit Line.

3. The memory of claim 1, wherein said restore circuit comprises:
   a cross-coupled latch having first and second sense nodes, with one of said first and second sense nodes connected to a reference voltage and the other of said first and second sense nodes connected to said outer Bit Line, said latch operable to distinguish between a logic "1" voltage and a logic "0" voltage on said outer Bit Line and operable to drive said outer Bit Line to substantially full logic levels as a function of the distinguished logic voltage thereon;
   a Write device for selectively connecting said outer Bit Line to said inner Bit Line to drive said inner Bit Line from said outer Bit Line; and
   a Restore control signal to activate said Write device during a restore operation after said access device has selectively connected one of said memory cells to said inner Bit Line.

4. The memory of claim 1, and further comprising:

a Data Line for being disposed at a logic "1" voltage or a logic "0" voltage;

an interface device for driving said Data Line from a source other than said inner Bit Line or said outer Bit Line, said interface device isolated from said outer Bit Line by said Bit Line preamp/driver circuit;

said interface device controlled by the logic voltage on said inner Bit Line such that the logic voltage on said Data Line corresponds to the logic voltage on said inner Bit Line; and a Read circuit for distinguishing between a logic "0" and a logic "1" voltage on said Data Line and driving said Data Line to either a full circuit potential or to ground in response to the logic state determined to be on said Data Line.

5. The memory of claim 4 wherein said interface device comprises:

a depletion transistor configured as a source follower having the source/drain path thereof disposed between a source other than said outer or inner Bit Line and said Data Line; and a current source for being driven by said depletion transistor, the gate of said depletion transistor controlled by the voltage on said inner Bit Line.

6. The memory of claim 1 and further comprising:

a Data Line for being disposed at either a logic "1" voltage or a logic "0" voltage;

an interface device for driving said Data Line from a source other than said outer Bit Line or said inner Bit Line;

said interface device controlled by the logic voltage on said outer Bit Line such that the logic voltage on said Data Line corresponds to the logic voltage on said outer Bit Line; and a Read circuit for distinguishing between a logic "0" and a logic "1" on said Data Line and driving said Data Line to either a full circuit potential or to ground in response to the logic state determined to be on said Data Line.

7. The memory of claim 6 wherein said interface device comprises:

a depletion transistor configured as a source follower having the source/drain path thereof disposed between a source other than said outer or inner Bit Lines; and a current source for being driven by said depletion transistor, the gate of said depletion transistor controlled by the voltage on said outer Bit Line.

8. A random access memory, comprising:

a plurality of single transistor memory cells configured in an array and each having a memory capacitor for storing a logic "0" voltage or a logic "1" voltage;

an inner Bit Line;

an access device for selectively connecting one of said memory cells to said inner Bit Line in response to an external access signal such that said memory capacitor can transfer charge to and from said inner Bit Line;

an outer Bit Line;

a Bit Line preamp/driver circuit for driving said outer Bit Line from a source different from said inner Bit Line as said access device accesses said memory cell, such that said outer Bit Line is not directly coupled to said inner Bit Line, said outer Bit Line driven toward either a logic "1" voltage or a logic "0" voltage corresponding to the voltage stored in said accessed memory cell; and a precharge device for precharging said inner Bit Line to a predetermined voltage, said Bit Line preamp/driver circuit operable to shift the voltage on said outer Bit Line to a voltage higher than that on said inner Bit Line for at least one logic state stored in said memory cell.

9. The memory of claim 8, wherein said predetermined voltage is ground.

10. The memory of claim 8, wherein said predetermined voltage is equal to one half of the full supply voltage.

11. The memory of claim 8, wherein said outer Bit Line is precharged to a predetermined voltage.

12. The memory of claim 11, wherein the difference between the voltage on said inner Bit Line and the voltage to which said outer Bit Line is driven by said Bit Line preamp/driver circuit is substantially equal to the voltage to which said outer Bit Line is precharged to.

13. A method for accessing data stored in one of a plurality of single transistor memory cells, each memory cell having a memory capacitor for storing a logic "0" or a logic "1" voltage, comprising the steps of:

providing an inner Bit Line;

accessing one of the single transistor memory cells and connecting the associated memory capacitor to the inner Bit Line such that the memory capacitor can transfer charge to and from the inner Bit Line;

providing an outer Bit Line;

driving the outer Bit Line from a source different than the inner Bit Line as the memory cell is accessed during the step of accessing the memory cell, such that the outer Bit Line is not directly coupled to the inner Bit Line, the outer Bit Line driven toward either a logic "1" voltage or a logic "0" voltage corresponding to the voltage stored in the accessed memory cell; and sensing the logic state on the outer Bit Line during a step of restoring, and driving the voltage on the outer Bit Line to a full logic voltage or to a ground voltage, respectively, during a Restore operation, and substantially concurrently driving the inner Bit Line to the same voltage that is on the outer Bit Line.

14. The method of claim 13, and further comprising distinguishing between a logic "0" and a logic "1" voltage on the outer Bit Line and driving the outer Bit Line to a substantially amplified voltage in response to the logic states determined to be on the outer Bit Line.

15. The method of claim 13, wherein the step of restoring comprises:

providing a cross-coupled latch having first and second sense nodes;

connecting one of the sense nodes to a reference voltage;

connecting the other sense node to the outer Bit Line;

determining whether the voltage on the other sense node is greater than or less than the reference voltage;

driving the sense node connected to the outer Bit Line to a full logic voltage when the voltage on the outer Bit Line is greater than the reference voltage and to a ground voltage when the voltage on the outer Bit Line is lower than the reference voltage, the reference voltage having a value disposed between that existing on the outer Bit Line, substantially midway between a logic "0" and a logic "1" voltage;

selectively connecting the outer Bit Line to the inner Bit Line to drive the inner Bit Line from the outer Bit Line in response to a restore control signal; and generating the restore control signal to activate the step of selectively connecting during a restore operation after the step of accessing.

16. The method of claim 13, and further comprising:

providing a Data Line separate from the outer Bit Line and having either a logic "1" or a logic "0" voltage disposed thereon;

interfacing the Data Line with the inner Bit Line such that the Data Line is driven from a source other than the outer Bit Line or the inner Bit Line;

controlling the step of interfacing with the voltage on the inner Bit Line such that the logic voltage on the Data Line corresponds to the logic voltage on the inner Bit Line; and distinguishing between a logic "0" and a logic "1" voltage on the Data Line and convening the voltage on the Data Line to either a full circuit voltage or to a ground voltage in response to the logic state determined to be on the Data Line.

17. The method of claim 16 wherein the step of interfacing comprises:

providing a depletion source follower transistor having a gate and a source/drain path, the source/drain path connected on one side to a supply voltage and other than the inner or outer Bit Lines;

controlling the gate of the source follower with a voltage corresponding to the voltage on the inner Bit Line; and driving a current source and the Data Line with the other side of the source/drain path of the source follower transistor.

18. The method of claim 13, and further comprising:

providing a Data Line separate from the inner and outer Bit Lines and having a logic "1" or a logic "0" voltage disposed thereon;

interfacing the Data Line with the outer Bit Line such that the Data Line is driven from a source other than the inner Bit Line or the outer Bit Line; and controlling the step of interfacing with the voltage on the outer Bit Line such that the logic voltage on the Data Line corresponds to the logic voltage on the outer Bit Line;

distinguishing between a logic "0" and a logic "1" voltage on the Data Line and converting the voltage on the Data Line to either a full circuit voltage or to a ground voltage in response to the logic state determined to be on the Data Line.

19. The method of claim 18 wherein the step of interfacing comprises:

providing a depletion source follower transistor having a gate and a source/drain path, the source/drain path connected on one side to a supply voltage other than the outer or inner Bit Lines;

controlling the gate of the source follower with the voltage on the outer bit line; and driving a current source and the Data Line with the other side of the source/drain path of the source follower transistor.

20. A method for accessing data stored in one of a plurality of single transistor memory cells, each memory cell having a memory capacitor for storing a logic "0" or a logic "1" voltage, comprising the steps of:

providing an inner Bit Line;

accessing one of the single transistor memory cells and connecting the associated memory capacitor to the inner Bit Line such that the memory capacitor can transfer charge to and from the inner Bit Line;

providing an outer Bit Line;

driving the outer Bit Line from a source different than the inner Bit Line as the memory cell is accessed during the step of accessing the memory cell, such that the outer Bit Line is not directly coupled to the inner Bit Line, the outer Bit Line driven toward either a logic "1" voltage or a logic "0" voltage corresponding to the voltage stored in the accessed memory cell; and precharging the inner Bit Line to a predetermined voltage, wherein the step of driving the outer Bit Line from a source different from the inner Bit Line comprises shifting the voltage on the outer Bit Line to a voltage higher than that on the inner Bit Line for at least one logic state on the memory cell.

21. The method of claim 20, wherein the step of precharging is operable to precharge the inner Bit Line to substantially ground.

22. The method of claim 20, wherein the step of precharging is operable to precharge the inner Bit Line to a voltage of substantially one half of the full circuit potential.

23. The method of claim 20, and further comprising precharging the outer Bit Line to a predetermined precharge voltage.

24. The method of claim 23, wherein the difference between the voltage to which the outer Bit Line is driven during the step of accessing and the voltage the inner Bit Line for the highest logic potential thereon is substantially equal to the voltage to which the outer Bit Line is precharged.

25. The method of claim 13 wherein the step of driving the outer Bit Line comprises:

providing a depletion device having a negative threshold and connecting the gate thereof to the inner Bit Line;

connecting one side of the source/drain path of the depletion transistor to the gate of an enhancement transistor;

connecting one side of the source/drain path of the depletion transistor to the gate of an enhancement transistor;

connecting one side of the source/drain path of the enhancement transistor to a source voltage and the other side thereof to the outer Bit Line; and driving the side of the source/drain path thereof opposite to that connected to the gate of the enhancement transistor with a Read control voltage, activation of the Read control voltage operable to drive the outer Bit Line from the inner Bit Line.

\* \* \* \* \*

UNITED STATES PATENT AND TRADEMARK OFFICE
CERTIFICATE OF CORRECTION

PATENT NO. : 5,475,642
DATED : December 12, 1995
INVENTOR(S) : David L. Taylor

It is certified that error appears in the above-indentified patent and that said Letters Patent is hereby corrected as shown below:

Column 9, line 20, replace " "1"0 "with --1--.

Column 11, line 26, replace "01" with --O1--.

Column 15, Claim 16, line 15, replace "convening" with --converting--.

Column 16, Claim 24, line 35, insert --on-- following "voltage".

Signed and Sealed this

Thirtieth Day of July, 1996

BRUCE LEHMAN

Attest:

*Attesting Officer*  *Commissioner of Patents and Trademarks*